March 4, 1958 — CHAANG HUANG — 2,825,822

TRANSISTOR SWITCHING CIRCUITS

Filed Aug. 3, 1955

*INVENTOR.*
CHAANG HUANG

*BY* Elmer J. Nealon

ATTORNEY

United States Patent Office 2,825,822

Patented Mar. 4, 1958

2,825,822

TRANSISTOR SWITCHING CIRCUITS

Chaang Huang, Ipswich, Mass., assignor to Sylvania Electric Products Inc., a corporation of Massachusetts Application August 3, 1955, Serial No. 526,156

4 Claims. (Cl. 307—88.5)

Figures 1, 2, 3:
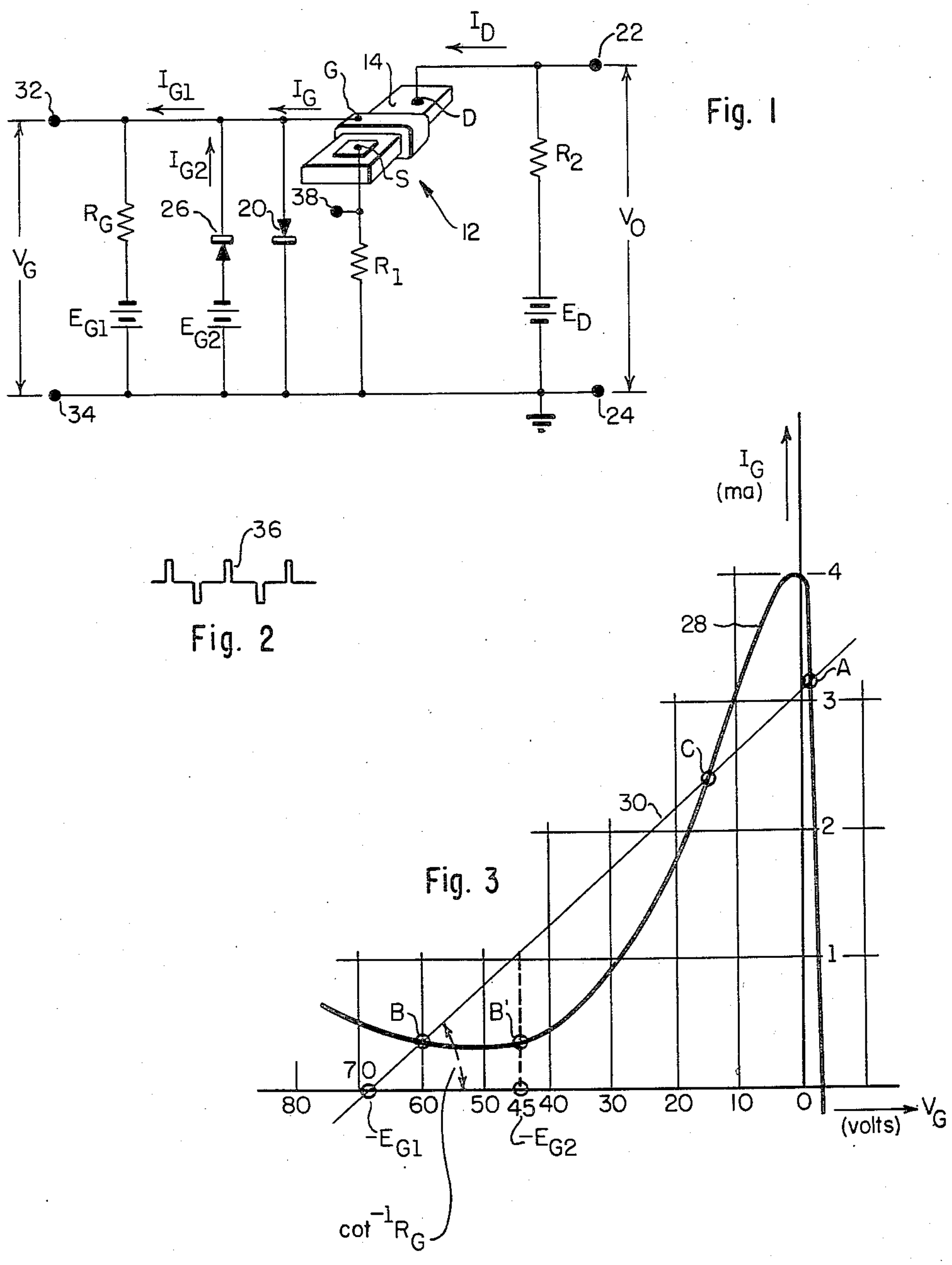

The present invention relates to transistor switching circuits, and more particularly to a bistable circuit having a single transistor.

According to this invention, the transistor is of the field effect type wherein the ohmic contact of the "drain" terminal has been replaced by a carrier-injecting contact. The result of this replacement is to produce a characteristic response to applied voltages that can be adapted to provide a bistable network.

It is an object of the present invention to provide such a bistable network utilizing a field effect transistor.

A further object is to provide a network that can produce a considerable voltage output swing as it moves from one condition of stability to the other.

A still further object is to provide means for protecting the transistor from voltage conditions that will cause damage thereto or difficulty in triggering the circuit from one stable condition to the other.

With the above and other objects in view, a feature of the invention resides in the use of a field effect transistor having a carrier-injecting "drain" contact wherein the triggering impulses are applied between the "gate" and the "source".

According to another feature, a D. C. bias voltage for the "gate" is connected through an impedance having a load line characteristic so located with respect to the transistor response characteristic as to indicate two conditions of circuit stability.

According to still another feature, I employ a second gate bias voltage source, connected through a rectifier to limit the gate voltage swing in the negative direction.

The foregoing and other features will be more fully understood and appreciated from the following description of a preferred embodiment of the invention, referring to the accompanying drawings, in which:

Fig. 1 is a schematic circuit diagram of the preferred embodiment, including an oblique view of the transistor showing its essential structure;

Fig. 2. illustrates a suitable input wave form; and

Fig. 3 illustrates the transistor characteristic and load line characteristic, and shows the bistable operation of the circuit.

Referring to Fig. 1, I preferably employ a modified field effect transistor 12, sometimes termed a unipolar field effect transistor, which comprises a slab 14 of n-type germanium with a p-type junction or "gate" G formed about the center of the slab. An ohmic contact or "source" S is placed upon the slab 14 in the vicinity of the "gate." Whereas the ordinary field effect transistor has a similar ohmic contact on the opposite side of the "gate", I replace such contact with a carrier-injecting type contact or "drain" D, such as is found at the emitter or collector of a typical junction transistor. Three external connections to the transistor are made, those being connected with the "source" S, the "gate" G and the "drain" D, respectively.

The field effect transistor is generally distinguished from the junction transistor principally in that the current flow is predominantly carried by one type of carrier alone, and the electric field intensity is relatively high, causing current flow by field drift rather than by diffusion. The characteristics are exemplified by the embodiment of Fig. 1. When a positive voltage is applied between the source S and the drain D by a battery $E_D$, an electric field is set up in the germanium. Hence, the carriers, which are electrons for the n-type germanium material, flow from the source S to the drain D. Following the usual convention, this flow comprises a current $I_D$ in the external drain circuit. Depending upon the value of the applied voltage $E_D$, the drain current may be substantial for a gate voltage near zero with respect to the source S. If a negative voltage is applied to the gate G, the drain current is caused to decrease by reason of the consequent change in the electric field. When the gate voltage is made sufficiently negative, the drain current $I_D$ ceases entirely except for the leakage current of the pn junction.

The circuit herein described is adapted for an input or gate voltage $V_G$ that normally varies between values in the negative range. Any substantial positive fluctuation of the gate voltage is prevented by a rectifier 20, for if a substantial positive potential difference existed between the gate and source the transistor might be damaged by excessive drain currents. Thus, the restrictions on gate voltage swing for this type of transistor are similar to the restrictions on the grid voltage of a vacuum tube to prevent the flow of excessive currents.

The source-drain circuit of the transistor is completed through the battery $E_D$ and resistors $R_1$ and $R_2$. The output voltage $V_0$ may be taken from terminals 22 and 24.

The principal gate circuit includes a gate bias source $E_{G1}$ and a resistor $R_G$. A source $E_{G2}$, also negative but of lesser magnitude than the source $E_{G1}$, is connected through a rectifier 26 between ground and the gate G. The function of the source $E_{G2}$ is to prevent the gate voltage from reaching a value more negative than the value of the source $E_{G2}$, for a reason hereinafter more fully explained.

The curve 28 in Fig. 3 illustrates the input characteristic of the illustrated transistor in terms of the gate current $I_G$ as a function of the applied gate voltage $V_G$. It will be seen that for relatively large negative gate voltages, the current response corresponds with that of a relaitvely large positive resistance. As the magnitude of the negative gate voltage decreases, it reaches a point where a further decrease in the magnitude results in an increase of current, thus producing a so-called "negative resistance" characteristic similar to that found in a point contact transistor or a vacuum tube. In this "negative resistance" region, illustrated as being between approximately minus 50 volts and 0 volts, the increase in the drain current $I_D$ corresponds with the increase in the current $I_G$. When the applied gate voltage $V_G$ is reduced to zero from a negative value, the magnitude of the gate current $I_G$ reaches a maximum. As the applied voltage $V_G$ increases from zero in the positive direction, the magnitude of the gate current rapidly decreases.

The nature of the gate voltage-current characteristic described above permits the selection of a resistor $R_G$ and a source $E_{G1}$ having a load line 30 which intersects the curve 28 at three points A, B and C. As will be understood, this load line intersects the $V_G$ axis at the value of the source $E_{G1}$, and has a slope inversely proportional to the resistance $R_G$. On the assumption that all of the current $I_G$ passes through the resistor $R_G$, this line represents the locus of currents $I_G$ for all values of the voltage $V_G$ in the range under consideration.

Assuming for the moment that the battery $E_{G2}$ is removed, it will be apparent that the given circuit has three possible conditions of operation, as indicated by the points of intersection A, B and C. Of these, the points A and B represent stable conditions, and the point C an unstable condition. Thus a negative pulse of sufficient magnitude applied across input terminals 32 and 34 would switch the circuit to the stable condition at B, and a positive pulse would switch the circuit to the condition at A.

However, it is found that while the point B represents a stable condition, a better stable condition can be reached with improved trigger sensitivity by means of the addition of the source $E_{G2}$ and the rectifier 26. With the source $E_{G2}$ in the circuit, the voltage $V_G$ is prevented from becoming substantially more negative than $-E_{G2}$, and application of a negative input pulse brings about a stable condition at B′. In this condition, the curve 28 indicates that only a part of the current flowing in the resistor $R_G$ passes through the gate-source circuit. The balance of this current flows through the rectifier 26. It is obvious that substantially no current $I_{G2}$ flows for the stable condition at the point A.

The wave form 36 in Fig. 2 illustrates suitable input pulses to be applied between the terminals 32 and 34 of Fig. 1. A positive pulse brings about the condition illustrated at the point A, wherein the transistor is in the "on" or high conduction state. In this state the drain and gate currents $I_D$ and $I_G$ are both large, and the gate voltage $V_G$ reaches a value close to ground. A negative pulse switches the transistor to the "off" or low-conduction state. In this state, the drain and gate currents are both small and the gate voltage $V_G$ reaches a value close to the value of the source $-E_{G2}$, as indicated by the point B′. (While the point B′ is illustrated as being directly above the value $-E_{G2}$, this condition cannot be attained perfectly, since the rectifier 26 has a small but insubstantial impedance.)

From the foregoing, it will be appreciated that when the transistor is in the "on" condition, a high current $I_D$ flows, and the output voltage $V_0$ has a small, positive value. When the transistor is turned "off," the drain current $I_D$ is reduced to a low value, causing the voltage $V_0$ to reach a more positive value approaching that of the source $E_D$.

In the foregoing discussion it has been assumed that the input voltage is applied between the terminals 32 and 34. As an alternative, the input may be applied between a terminal 38 and ground (terminal 34), since this also produces the required source-gate potential variation. With this form of input the characteristics of the circuit remain essentially as described above.

It should also be noted that I have been principally concerned in the previous discussion with obtaining a bistable circuit. I may also produce a monostable circuit or an astable (oscillating) circuit by a suitable choice of circuit parameters having a load line 30 that intersects the curve 28 at only one point. Thus, if the line 30 intersects the curve 28 in the negative resistance region only, the circuit oscillates, as will be recognized from the fact that a point of intersection in this region represents an unstable condition.

The other alternative is for the load line 30 to intersect the curve 28 only in one or the other of the two positive resistance regions, in which case the point of intersection represents a stable condition and the circuit is monostable.

From the foregoing, it will be appreciated that a bistable network employing only a single transistor has been produced. This network is suitable for input pulses of alternating polarity, and is based upon a modified form of a field effect transistor having a carrier-injecting drain contact.

Having thus described the invention, I claim:

1. A bistable network comprising, in combination, a field effect transistor provided with source and gate connections and a carrier-injecting drain contact, an output circuit including a voltage source and connecting the source and drain, and an input circuit including branches connected in parallel between the source and gate, one branch including a voltage source and an impedance having a load characteristic intersecting the gate current-gate voltage characteristic of the transistor at two points of stability, and another branch including means to limit the negative swing of the input voltage to a value intermediate the values defined by the above-mentioned points of stability.

2. A bistable network comprising, in combination, a field effect transistor provided with source and gate connections and a carrier-injecting drain contact, an output circuit including a voltage source and connecting the source and drain, and an input circuit including branches connected in parallel between the source and gate, one branch including a voltage source and an impedance having a load characteristic intersecting the gate current-gate voltage characteristic of the transistor at two points of stability, a second branch including means to limit the negative swing of the input voltage to a value intermediate the voltage values defined by said points of stability, and a third branch including means to prevent the input voltage swing from increasing substantially in the positive direction beyond its more positive value at said points of stability.

3. A bistable network comprising, in combination, a field effect transistor provided with source and gate connections and a carrier-injecting drain contact, an output circuit including a direct-current source and a load impedance connected in series between the source and drain, and an input circuit including branches connected in parallel between the source and gate, one branch including a second direct-current source and a resistor having a load characteristic intersecting the gate current-gate voltage characteristic of the transistor at two points of stability, and a second branch including a third direct-current source and a rectifier in series, said third source having a value intermediate the voltage values defined by said points of stability.

4. The combination as defined in claim 3 including a rectifier connected directly between the source and gate to suppress substantial positive gate voltage swings.

References Cited in the file of this patent

UNITED STATES PATENTS

| | | |
|---|---|---|
| 2,644,887 | Wolfe | July 7, 1953 |

FOREIGN PATENTS

| | | |
|---|---|---|
| 1,075,316 | France | Oct. 14, 1954 |